(12) United States Patent
Kwak et al.

(10) Patent No.: US 9,765,426 B1
(45) Date of Patent: Sep. 19, 2017

(54) LITHIUM CONTAINING COMPOSITE METALLIC SPUTTERING TARGETS

(71) Applicant: APPLIED MATERIALS, INC., Santa Clara, CA (US)

(72) Inventors: Byung-Sung Leo Kwak, Portland, OR (US); Lizhong Sun, San Jose, CA (US); Jan Isidorsson, Sunnyvale, CA (US); Chong Jiang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 772 days.

(21) Appl. No.: 13/867,865

(22) Filed: Apr. 22, 2013

Related U.S. Application Data

(60) Provisional application No. 61/636,563, filed on Apr. 20, 2012.

(51) Int. Cl.
 *C23C 14/35* (2006.01)
 *C23C 14/34* (2006.01)
 *H01J 37/34* (2006.01)

(52) U.S. Cl.
 CPC ...... *C23C 14/3414* (2013.01); *H01J 37/3426* (2013.01); *H01J 37/3429* (2013.01)

(58) Field of Classification Search
 CPC .......................... H01J 37/3426; H01J 37/3429
 See application file for complete search history.

(56) References Cited

U.S. PATENT DOCUMENTS 5,507,897 A * 4/1996 Campet ............... C23C 14/3407
156/89.18
5,995,271 A 11/1999 Zieba et al.
(Continued)

FOREIGN PATENT DOCUMENTS

JP 60015482 A1 * 1/1985

OTHER PUBLICATIONS

Gillaspie, D., et al., "Nanocomposite Counter Electrode Materials for Electrochromic Windows," Journal of Electrochemical Society, vol. 157, No. 3, Jan. 2010, pp. H328-H331.
(Continued)

*Primary Examiner* — Jason M Berman
(74) *Attorney, Agent, or Firm* — Pillsbury Winthrop Shaw Pittman LLP

(57) ABSTRACT

The present invention relates to sputter targets for electrochemical device layer deposition comprising a lithium-containing target material with near-metallic electrical conductivity which includes (a) at least one metal and (b) a lithium-containing material, the lithium-containing material being selected from the group consisting of lithium metal and a lithium-containing salt, wherein the at least one metal and the lithium-containing material are formed into the lithium-containing target material and wherein the lithium-containing target material is configured with a composition sufficient for physical vapor deposition of a lithium-containing electrode of the electrochemical device in a single step, the lithium-containing electrode as deposited requiring no further lithium doping. Furthermore, the composition of the metallic lithium-containing target material may be configured to provide a low enough electrical resistance to permit DC sputtering. Chambers and tools including the sputter target and process flows for fabricating electrochemical devices including steps utilizing the sputter target are also described.

19 Claims, 10 Drawing Sheets

SECTION Y-Y

(56) References Cited

U.S. PATENT DOCUMENTS

| | | | |
|---|---|---|---|
| 6,559,593 B1* | 5/2003 | Heeks | C23C 14/205 204/192.14 |
| 2009/0057137 A1 | 3/2009 | Pitts et al. | |
| 2009/0288943 A1 | 11/2009 | Kwak et al. | |
| 2010/0007937 A1 | 1/2010 | Widjaja et al. | |
| 2010/0264017 A1* | 10/2010 | Nam | C23C 14/0623 204/192.15 |

OTHER PUBLICATIONS

Granqvist, C.-G., "Electrochromic Materials: Out of a Niche," Nature Materials, vol. 5, No. 2, Feb. 2006, pp. 89-90.

Dudney, N.J., "Solid-State Thin-Film Rechargeable Batteries," Materials Science and Engineering B 116 (2005), pp. 245-249.

Urbano, A., et al., "Electrochromism in lithiated nickel oxide films deposited by rf sputtering," Electrochemica Acta 46 (2001) pp. 2269-2273.

* cited by examiner

LITHIUM CONTAINING COMPOSITE METALLIC SPUTTERING TARGETS

CROSS-REFERENCE TO RELATED APPLICATIONS

This application claims the benefit of U.S. Provisional Application No. 61/636,563 filed Apr. 20, 2012, incorporated herein by reference in its entirety.

FIELD OF THE INVENTION

Embodiments of the present invention relate generally to target materials and compositions for electrochemical devices, including electrochromic devices and thin film batteries, in particular for the cathode and anode layers.

BACKGROUND OF THE INVENTION

Electrochromic (EC) devices are devices that change light (and heat) transmission properties in response to voltage applied across the device. Metal oxide based electrochromic devices can be fabricated which electrically switch between transparent and absorbing states (where the transmitted light may be colored). Furthermore, certain transition metal hydride electrochromic devices can be fabricated which switch between transparent and reflective states. Electrochromic devices are incorporated in a range of products, including architectural windows, rear-view mirrors, and protective glass for museum display cases.

A prior art electrochromic device 100 is represented in FIGS. 1 & 2, which show a schematic representation of the electrochromic device illustrating ion conduction between anode and cathode, and a cross-sectional representation of the electrochromic device, respectively. See Granqvist, C.-G., Nature Materials, v5, n2, February 2006, p 89-90; C.-G. Granqvist *Handbook of Inorganic Electrochromic Materials*, Elsevier, 1995; and U.S. Pat. No. 5,995,271 to Zieba et al. The device 100 comprises a glass substrate 110, lower transparent conductive oxide (TCO) layer 120, a cathode 130, a solid electrolyte 140, a counter electrode (anode) 150, upper TCO layer 160, a protective coating 170, a first electrical contact 180 (to the lower TCO layer 120), and a second electrical contact 190 (to the upper TCO layer 160). Furthermore, there may be a diffusion barrier layer (not shown) between the glass substrate 110 and the lower TCO layer 120, to reduce the diffusion of ions from the glass substrate into the TCO layer, and vice versa. Note that the component layers are not drawn to scale in the electrochromic devices shown in FIGS. 1 & 2. For example, a typical glass substrate is of the order of a millimeter thick and a typical electrochromic device covers the fully exposed area of the architectural glass, or rear-view mirror, for example. Other substrate materials may be used, for example plastics such as polyimide (PI), polyethylene terephthalate (PET) and polyethylene naphthalate (PEN). Typical component layer thicknesses are given in the table below:

| Component Layer | Thickness (microns) |
| --- | --- |
| lower TCO layer | 0.1 to 1.0 |
| cathode | 0.03 to 1.0 |
| solid electrolyte | 0.005 to 0.5 |
| counter electrode | 0.03 to 1.0 |
| upper TCO layer | 0.1 to 1.0 |
| diffusion barrier layer | 0.1 to 1.0 |

Switching from a transparent to a colored state for the EC device occurs when ions (such as lithium or hydrogen ions) are driven from the counter electrode 150, through the (non electrically conductive) solid electrolyte 140, to the cathode 130. The counter electrode 150 is an ion storage film, and the cathode 130 is electrochromic—providing the desired change in light transmission properties. It is also possible for the counter electrode 150 to function as the electrochromic layer if this layer undergoes an "anodic coloration," where the layer changes from transparent to colored with de-intercalation of the ion. In this case, the cathode becomes the counter electrode. One can also create greater contrast by combining the effects of both electrodes. A more detailed discussion of the functioning of electrochromic devices is found in Granqvist, C.-G., Nature Materials, v5, n2, February 2006, p 89-90 and C.-G. Granqvist *Handbook of Inorganic Electrochromic Materials*, Elsevier, 1995. For the device to function properly, the lower TCO layer 120 and the cathode 130 must be electrically isolated from the counter electrode 150 and upper TCO layer 160. Electrical contact to external driver circuits is made through the first and second electrical contacts 180 and 190.

The performance of an EC device relies on the transport properties for ions ($H^+$, $Na^+$ and $Li^+$) and optical behaviors of the electrode and electrolyte materials, and other layers in the device. In order to enhance these properties, the electrode layers are typically doped with various elements from the periodic table, of which the most prominent ones are the transition metals. As the desired layers are typically metal oxides, the "doped" layers are typically deposited with reactive sputtering methods with doped metallic target materials. In addition, there is typically a separate step to intercalate the charge carriers—commonly Li—into the electrodes. The intercalation can be done with either wet or dry lithiation. In either case, the manufacturing process can be severely hampered by the need to deal with reactive Li metal and with procedures to wet lithiate the electrodes.

A typical TFB device structure 300 is shown in FIG. 3, where anode current collector 360 and cathode current collector 320 are formed on a substrate 310, followed by cathode 330, electrolyte 340 and anode 350; although the device may be fabricated with the cathode, electrolyte and anode in reverse order. Furthermore, the cathode current collector (CCC) and anode current collector (ACC) may be deposited separately. For example, the CCC may be deposited before the cathode and the ACC may be deposited after the electrolyte. The device may be covered by an encapsulation layer 370 to protect the environmentally sensitive layers from oxidizing agents. See, for example, N. J. Dudney, Materials Science and Engineering B 1 16, (2005) 245-249. One or more of the electrodes incorporates a mobile ion, such as $Li^+$—for example $Li^+$ in a $LiCoO_2$ cathode. The same concerns discussed above for electrochromic devices may apply to thin film battery fabrication.

SUMMARY OF THE INVENTION

The present invention relates, in general, to metallic targets for DC sputter depositing thin films of electrode materials in electrochemical devices such as thin film batteries (TFBs), electrochromic (EC) devices, etc.

According to aspects of the present invention a sputter target for electrochemical device layer deposition may comprise: (1) a lithium-containing target material with near-metallic electrical conductivity which may comprise (a) at least one metal and (b) a lithium-containing material, the lithium-containing material being selected from the group consisting of lithium metal and a lithium-containing salt, wherein the at least one metal and the lithium-containing material are formed into the lithium-containing target material and wherein the lithium-containing target material is configured with a composition sufficient for physical vapor deposition of a lithium-containing electrode of the electrochemical device, the lithium-containing electrode as deposited requiring no further lithium doping; and (2) a backing plate, the lithium-containing target material being affixed to the backing plate. Furthermore, the surface resistance of the lithium-containing target material may be in the range of 200 kΩ to 500 kΩ as measured between two probes separated by 6 mm on the surface of the lithium-containing target material, and/or the resistance of the lithium-containing target material may be in the range of 200 kΩ to 500 kΩ as measured between the backing plate and the sputtering surface of the lithium-containing target material.

Furthermore, some embodiments of the present invention are deposition chambers for fabrication of the cathode and anode materials of electrochemical devices, the tools including lithium containing composite sputter targets as described herein.

Yet furthermore, some embodiments of the present invention are methods of fabricating an electrochemical device using a sputter target comprising a lithium-containing target material with near-metallic electrical conductivity suitable for a single step physical vapor deposition of lithium-containing electrodes as described herein, the lithium-containing electrodes as deposited requiring no further lithium doping.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Figure 1:
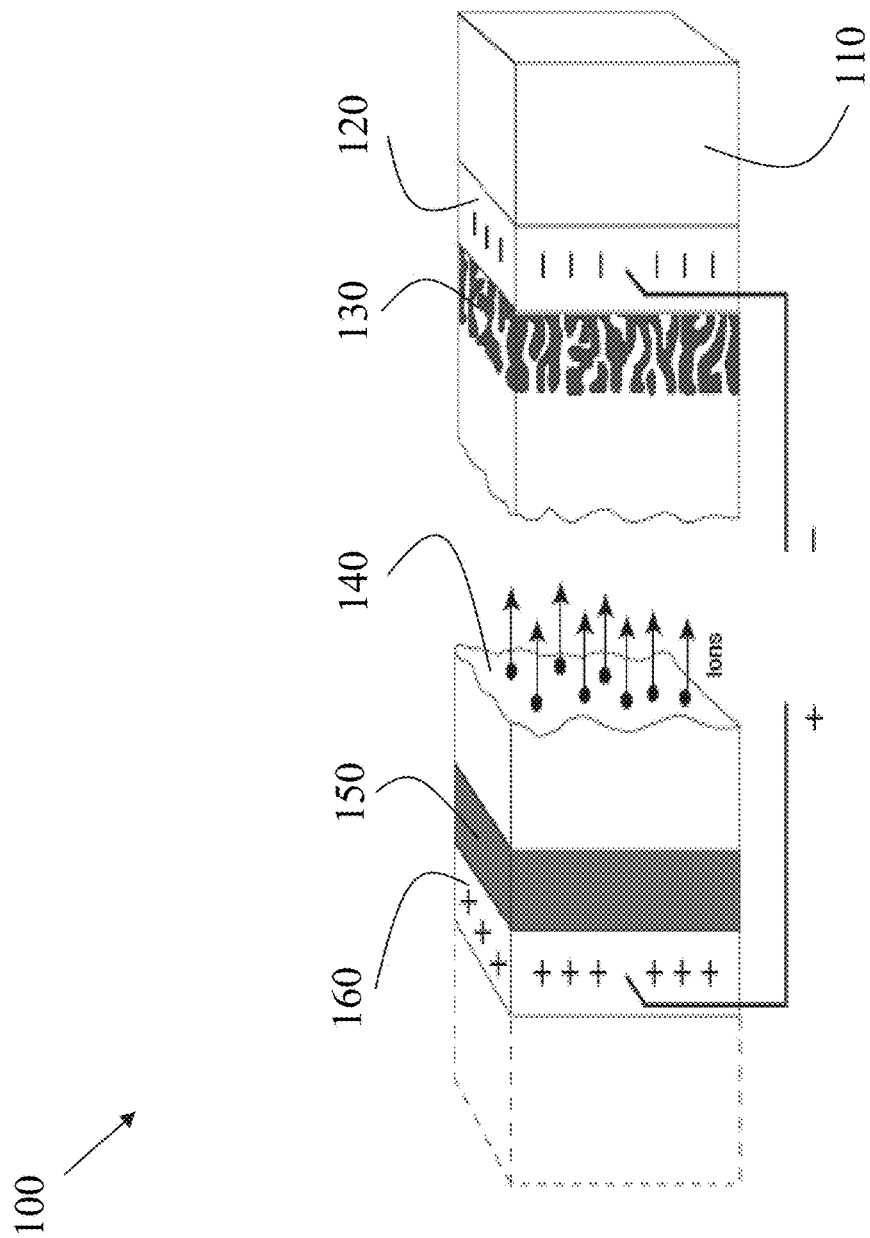
FIG. 1 illustrates a schematic representation of an electrochromic device showing ion conduction between anode and cathode.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In the present invention lithium containing composite sputter targets are disclosed for use primarily in forming cathode and anode materials in electrochemical devices. These targets are formed to have near-metallic electrical conductivity and may be used for DC or pulsed DC sputtering; these targets may also be used for other non-RF sputtering. Advantages of these targets may include one or more of: (1) reduction of deposition (and other) steps necessary to create the device; (2) improved manufacturability of the devices; (3) no need for RF sputtering that is slow and inherently complex and costly; and (4) cost of ownership reduction (due to eliminating RF sputtering and use of higher deposition rate processes such as DC and pDC sputtering).

According to the present invention, composite targets for use in depositing layers of electrochemical devices, such as electrochromic devices, may comprise the elements of a specific electrochemical layer and Li. These targets are desired to: (1) be metallic in nature for use with high deposition capable PVD processes, like DC or pulsed DC sputtering, for which the target surface resistance and the resistance measured through the backing plate to the top surface of the target is desired to be in the range of 200 kΩ to 500 kΩ, or lower (for this measurement, the target is comprised of 6 mm thick tiles mounted on a Cu/Cr backing plate; the target surface resistance is a two point resistance measurement on the top surface of the tile, with a 6 mm separation between probes; the resistance measured through the backing plate to the top surface of the target will provide a lower resistance measurement than the surface resistance); and (2) contain sufficient Li to eliminate the need for subsequent Li doping steps. The source of lithium for the target may be pure Li or Li containing salts, such as LiOH, $Li_2O$, $Li_2CO_3$, $LiWO_3$, $Li_2WO_4$, etc. Furthermore, other lithium metal oxides, such as Li Ni oxides, may be used, and lithium intermetallics, such as Li—Ni and Li—Ti, may be used, although the latter may require reactive sputtering. The salt content should be below the percolation threshold (typically 67%), as the percolation theory of electrical conduction requires a minimum of metal (typically at least 33%) to provide electrical conductivity through the target. (The given thresholds are applicable to a composite target with finely divided constituent materials.) Those skilled in the art will appreciate that these thresholds are dependent on the size and shape of constituent materials and adjustments may be made accordingly.

Specific examples of composite targets for forming electrode layers of electrochromic devices according to some embodiments of the present invention include the following. (Note that the ratio of component metals and deposition conditions are varied as needed to provide the desired layer composition, and that there are multiple options available for controlling the composition of the deposited layer, including, for example, reactive sputtering, impartation of energy to the layer during deposition, post-deposition processing such as annealing, etc.)

A first example of a composite target is a molybdenum doped nickel target for sputter depositing $Li_xMo_yNi_zO_d$ electrodes. The target is formed from metallic Mo and Ni, and the Li component comes from either metallic Li, or non-metallic LiOH, $Li_2O$, $Li_2CO_3$, $LiMoO_3$, $Li_2MoO_4$, etc. The ratio of component metals and deposition conditions are varied as needed to provide the desired electrode composition.

A second example of a composite target is a titanium doped tungsten target for sputter depositing $Li_xTi_yW_zO_d$ electrodes. The target is formed from metallic Ti and W, and the Li component comes from either metallic Li, or non-metallic LiOH or $Li_2CO_3$. The ratio of component metals and deposition conditions are varied as needed to provide the desired electrode composition.

A third example of a composite target is a tungsten doped nickel target for sputter depositing $Li_xW_yNi_zO_d$ electrodes. The target is formed from metallic W and Ni, and the Li component comes from either metallic Li, or non-metallic LiOH, $Li_2CO_3$, $Li_2O$, $LiWO_3$, or $Li_2WO_4$. The ratio of component metals and deposition conditions are varied as needed to provide the desired electrode composition. W doped Ni targets with varying Li content were fabricated using $Li_2CO_3$. Note that the targets were "dark" in nature, indicating that the material is electrically conductive and thus suitable for DC or pDC methods.

A fourth example of a composite target is a chromium doped nickel target for sputter depositing $Li_xCr_yNi_zO_d$ electrodes. The target is formed from metallic Cr and Ni, and the Li component comes from either metallic Li, or non-metallic LiOH or $Li_2CO_3$. The ratio of component metals and deposition conditions are varied as needed to provide the desired electrode composition.

A fifth example of a composite target is a cobalt doped nickel target for sputter depositing $Li_xCo_yNi_zO_d$ electrodes. The target is formed from metallic Co and Ni, and the Li component comes from either metallic Li, or non-metallic LiOH or $Li_2CO_3$. The ratio of component metals and deposition conditions are varied as needed to provide the desired electrode composition.

Example configurations for targets according to some embodiments of the present invention used in a single wafer chamber (Applied Materials Endura™ and Centura™, for example) and inline tools (Applied Materials New Aristo™ and Aton™, for example) are shown in FIGS. 4A-B and 5A-B, respectively.

Figure 4:
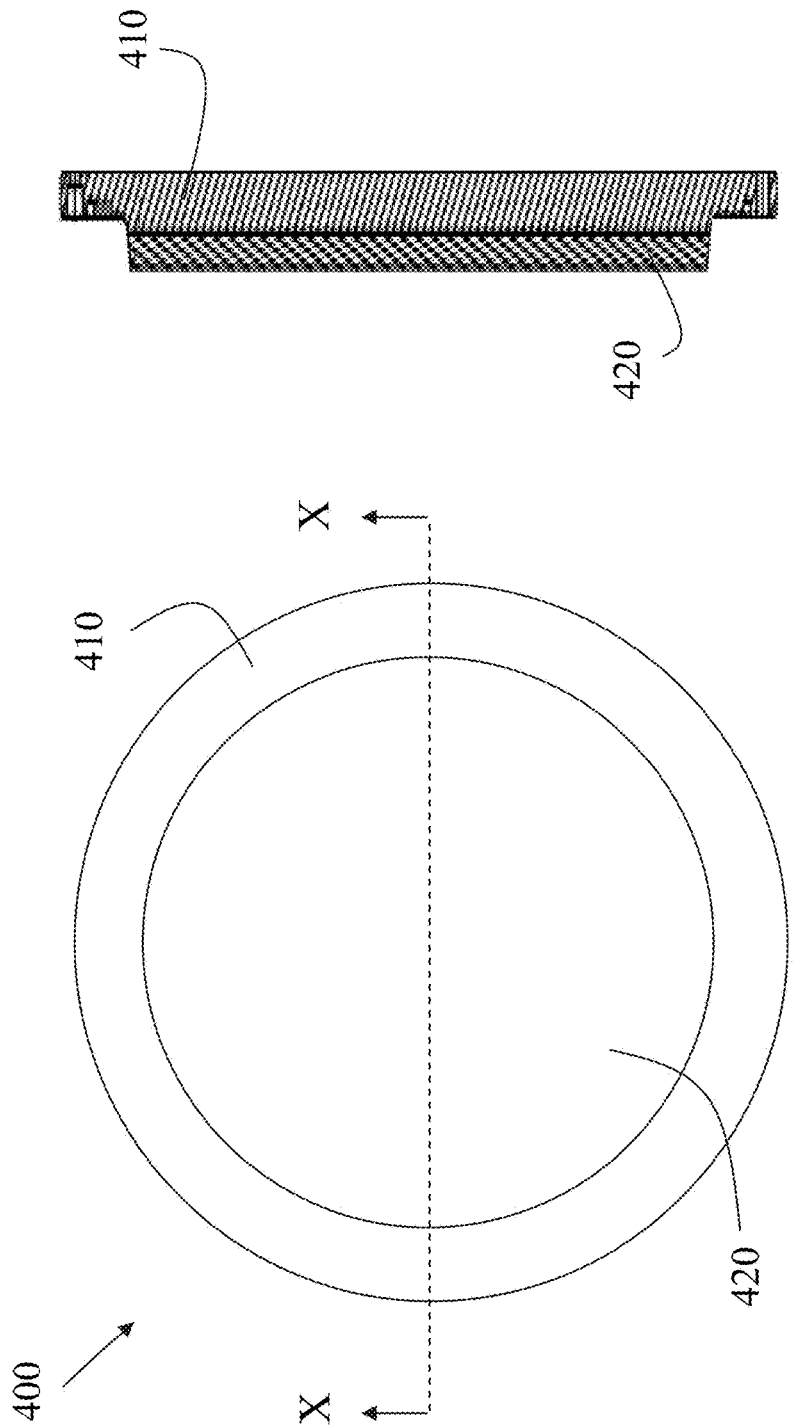
FIGS. 4A & 4B are plan and cross-sectional views, respectively, of a sputter target for deposition of electrode materials in a cluster tool, according to some embodiments of the present invention.

FIGS. 4A & 4B are plan and cross-sectional views, respectively, of a sputter target 400 for deposition of electrode materials in a cluster tool, according to some embodiments of the present invention. The target material 420 is affixed to a backing plate 410—the target material may be fabricated as tiles which are bonded to the backing plate 410, although the target material may be a single piece. The diameter of the target material 420 is typically much greater than the wafer diameter of the cluster tool. For example, the target material diameter may be 13.7 inches for a 200 mm diameter substrate cluster tool.

Figure 5:
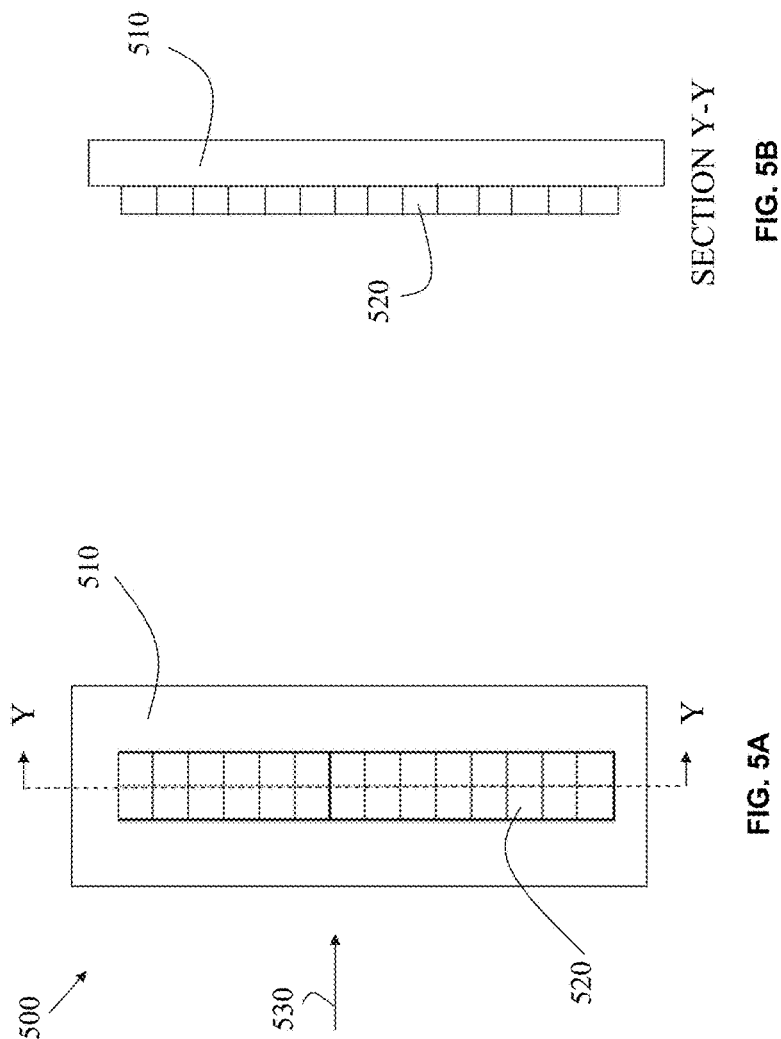
FIGS. 5A & 5B are plan and cross-sectional views, respectively, of a sputter target for deposition of electrode materials in an in-line tool, according to some embodiments of the present invention.

FIGS. 5A & 5B are plan and cross-sectional views, respectively, of a sputter target 500 for deposition of electrode materials in an in-line tool, according to some embodiments of the present invention. The target material 520 is affixed to a backing plate 510—the target material may be fabricated as tiles which are bonded to the backing plate 510. The width of the target material 520, perpendicular to the direction 530 of movement of the substrate through the in-line tool, is typically much greater than the substrate width, again perpendicular to the direction 530, of the in-line tool. For example, the target material width may be 200 to 300 mm wider/longer than the substrate width. Note that the target is shown as a series of tiles affixed to the backing plate 510; however, the target may be a single piece, particularly for smaller targets.

Figure 6:
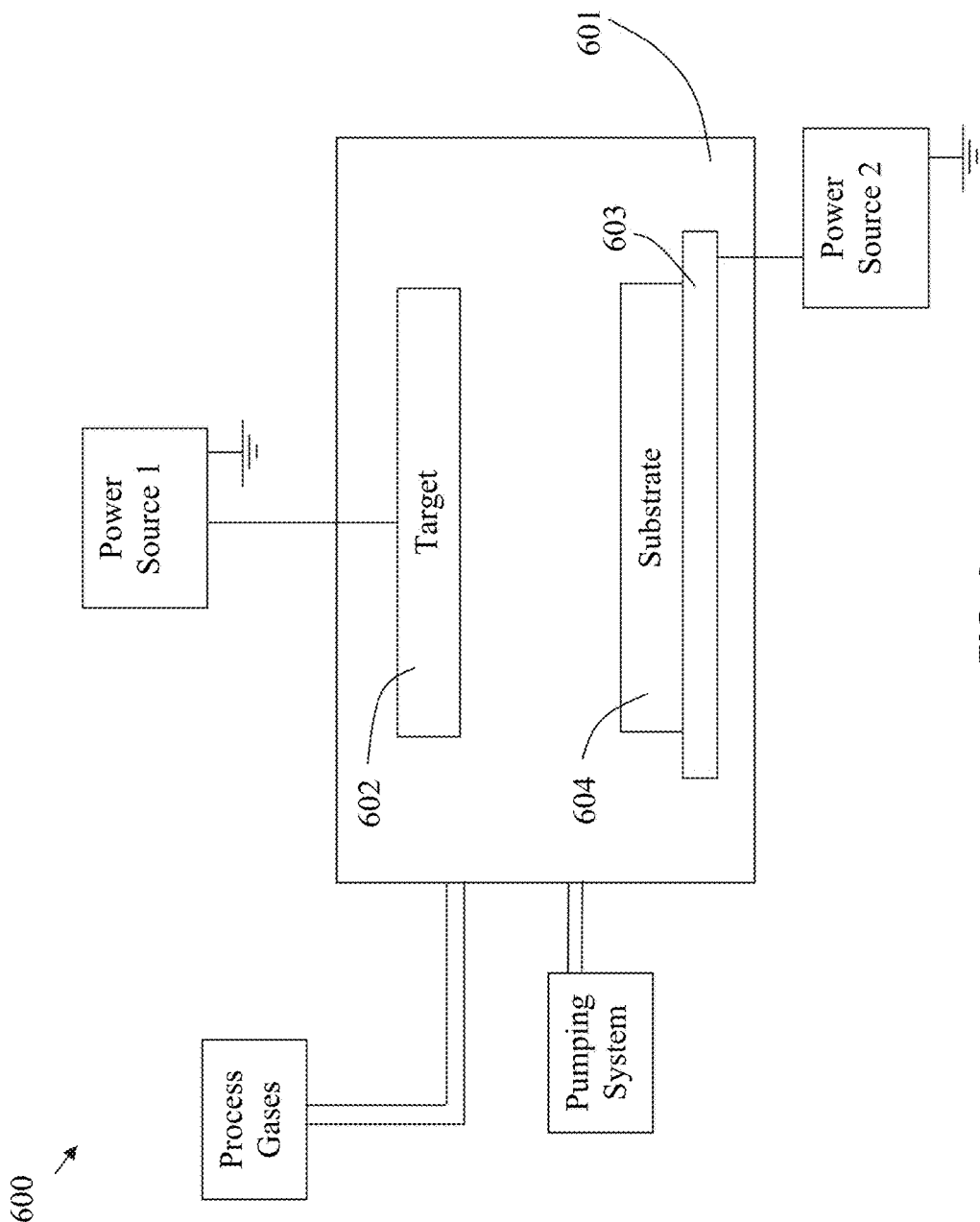
FIG. 6 is a schematic representation of a deposition chamber with a sputter target, according to some embodiments of the present invention.

FIG. 6 shows a schematic representation of a deposition chamber with a sputter target, according to some embodiments of the present invention. A vacuum chamber 601 contains a sputter target 602 and substrate 604 held on a substrate holder 603. Process gases, such as argon and/or a reactive gas, if required, are controllably released into the chamber and a pumping system maintains a desired vacuum in the chamber. Power source 1 is connected to the target for applying DC or pulsed DC power to the target for sputtering of said target. Note that pulsed DC may be preferred if certain reactive gases are used which may result in a "poisoned" target surface—for example, when using reactive gases containing oxygen, oxides may be formed on the target surface which increase the electrical resistance of the target such that DC sputtering may no longer be efficient, and pulsed DC is needed for an efficient deposition process. A second power source—power source 2—may be used to improve deposition as described in U.S. Patent Appl. Pub. No. 2009/0288943. The schematic representation of a deposition chamber in FIG. 6 is generic to both static and dynamic deposition—for example, the chamber may be a cluster tool chamber or an in-line tool chamber.

Figure 2:
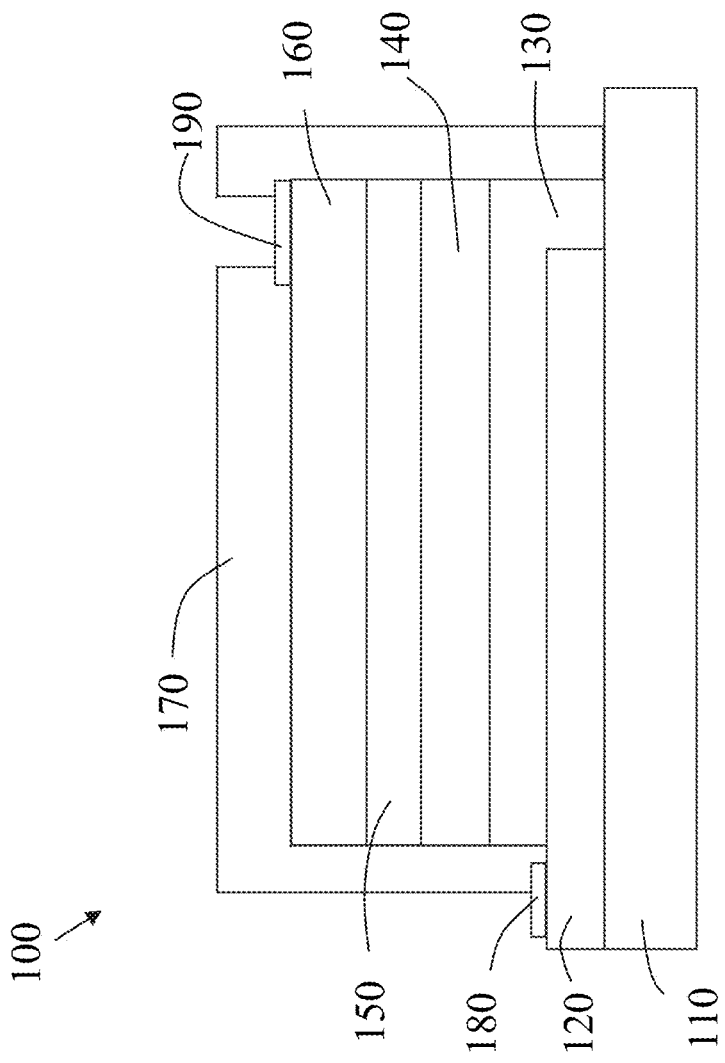
FIG. 2 is a cross-sectional representation of a prior art electrochromic device.

A process flow for fabricating an electrochromic device according to the present invention may include: providing a substrate; depositing a cathode layer; depositing an electrolyte layer on the cathode layer; and depositing an anode on the electrolyte layer; wherein the depositing of the cathode layer may be by a one step PVD process such as DC or pulsed DC sputtering of a target incorporating lithium, said target having near-metallic electrical conductivity; and wherein the depositing of the anode layer may be by a one step PVD process such as DC or pulsed DC reactive sputtering of a target incorporating lithium, said target having near-metallic electrical conductivity. Deposition of the other layers of the electrochromic device, such as shown in FIGS. 1 & 2, and described above, may be carried out using tools and process steps well known to those of ordinary skill in the art.

Figure 7:
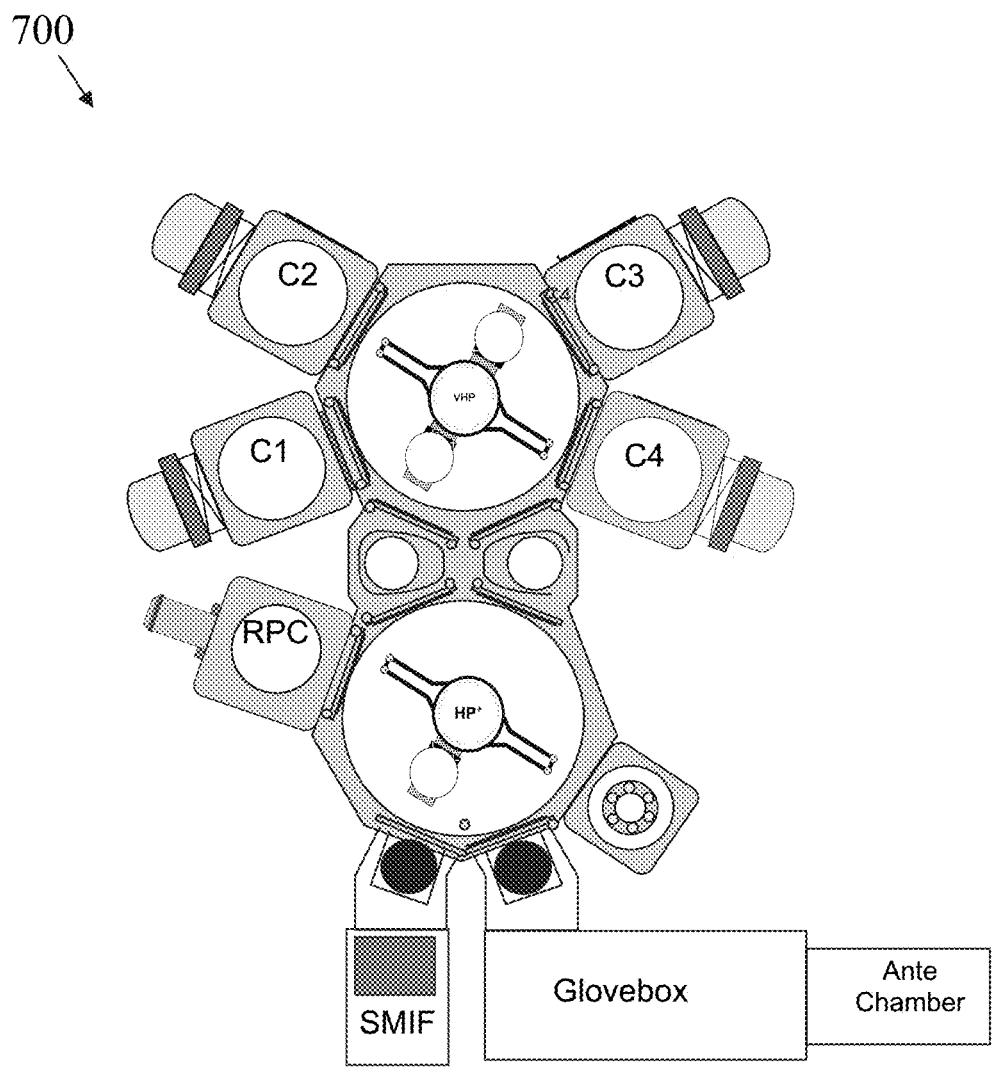
FIG. 7 is a schematic illustration of a thin film deposition cluster tool, according to some embodiments of the present invention.

FIG. 7 is a schematic illustration of a processing system 700 for fabricating an electrochemical device, such as a TFB or EC device, according to some embodiments of the present invention. The processing system 700 includes a standard mechanical interface (SMIF) to a cluster tool equipped with a reactive plasma clean (RPC) chamber and process chambers C1-C4, which may be utilized in the process steps described above. A glovebox may also be attached to the cluster tool if needed. The glovebox can store substrates in an inert environment (for example, under a noble gas such as He, Ne or Ar), which is useful after alkali metal/alkaline earth metal deposition. An ante chamber to the glovebox may also be used if needed—the ante chamber is a gas exchange chamber (inert gas to air and vice versa) which allows substrates to be transferred in and out of the glovebox without contaminating the inert environment in the glovebox. (Note that a glovebox can be replaced with a dry room ambient of sufficiently low dew point as such is used by lithium foil manufacturers.) The chambers C1-C4 can be configured for process steps for manufacturing electrochemical devices, such as thin film batteries, which may include: deposition of a Li containing electrode by DC or pulsed-DC sputter deposition, as described above. Examples of suitable cluster tool platforms include Applied Material's Endura™, and Centura™ for smaller substrates. It is to be understood that while a cluster arrangement has been shown for the processing system 700, a linear system may be utilized in which the processing chambers are arranged in a line without a transfer chamber so that the substrate continuously moves from one chamber to the next chamber.

Figure 8:
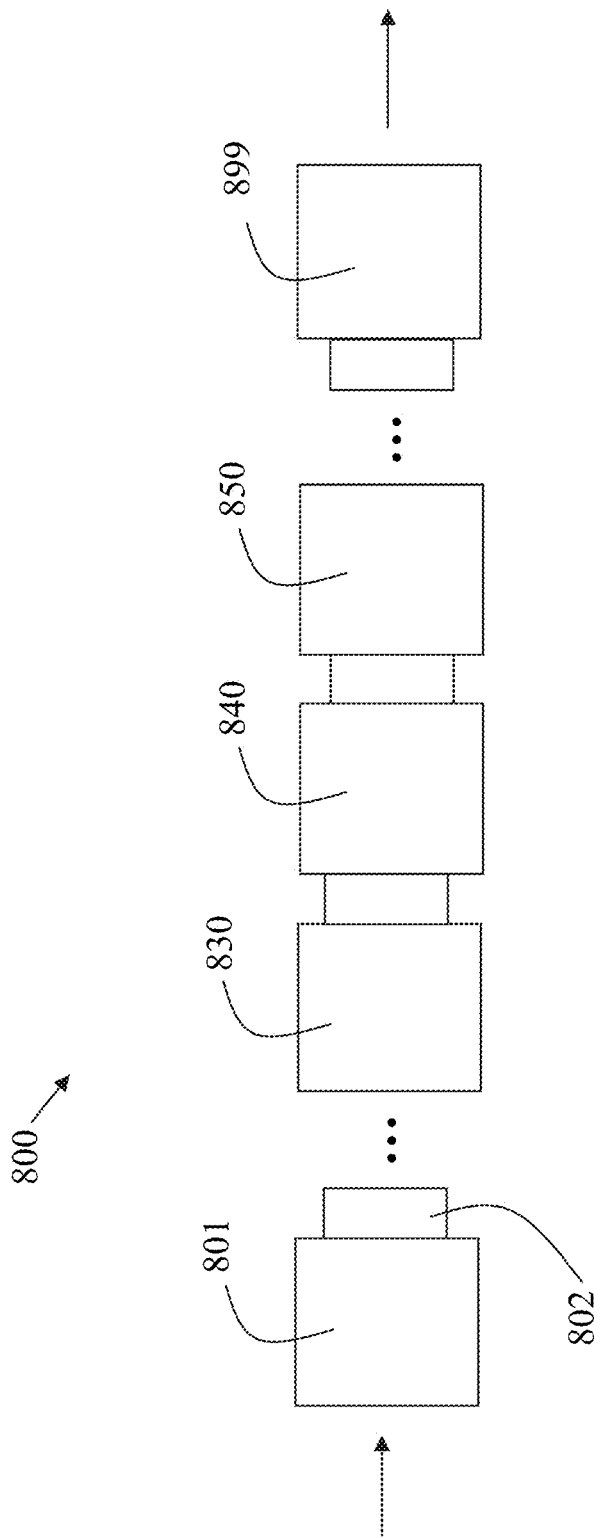
FIG. 8 is a representation of a thin film deposition system with multiple in-line tools, according to some embodiments of the present invention.

FIG. 8 shows a representation of an in-line fabrication system 800 with multiple in-line tools 801 through 899, including tools 830, 840, 850, according to some embodiments of the present invention. In-line tools may include tools for depositing all the layers of an electrochemical device—including both electrochromic devices and TFBs. Furthermore, the in-line tools may include pre- and post-conditioning chambers. For example, tool 801 may be a pump down chamber for establishing a vacuum prior to the substrate moving through a vacuum airlock 802 into a deposition tool. Some or all of the in-line tools may be vacuum tools separated by vacuum airlocks. Note that the order of process tools and specific process tools in the process line will be determined by the particular electrochromic device fabrication method being used. For example, one of the in-line tools may be dedicated to depositing a Li containing electrode layer according to some embodiments of the present invention by DC or pulsed DC sputter deposition, as described above. Furthermore, substrates may be moved through the in-line fabrication system oriented either horizontally or vertically.

Figure 9:
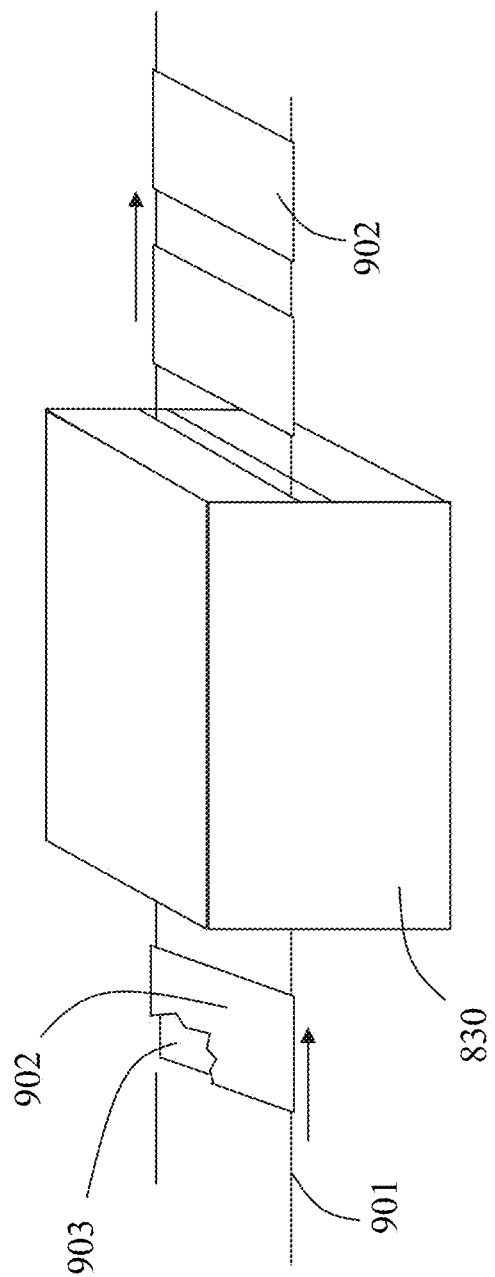
FIG. 9 is a representation of an in-line deposition tool, according to some embodiments of the present invention.

In order to illustrate the movement of a substrate through an in-line fabrication system such as shown in FIG. 8, in FIG. 9 a substrate conveyer 901 is shown with only one in-line tool 830 in place. A substrate holder 902 containing a substrate 903 (the substrate holder is shown partially cut-away so that the substrate can be seen) is mounted on the conveyer 901, or equivalent device, for moving the holder and substrate through the in-line tool 830, as indicated. A suitable in-line platform for processing tool 830 with vertical substrate configuration is Applied Materials New Aristo™. A suitable in-line platform for processing tool 830 with horizontal substrate configuration is Applied Materials Aton™. Another suitable large area coater is Applied Materials PIVOT™. In these large area coater platforms, either planar or rotatable cylindrical targets may be used, as discussed in more detail below.

Figure 10:
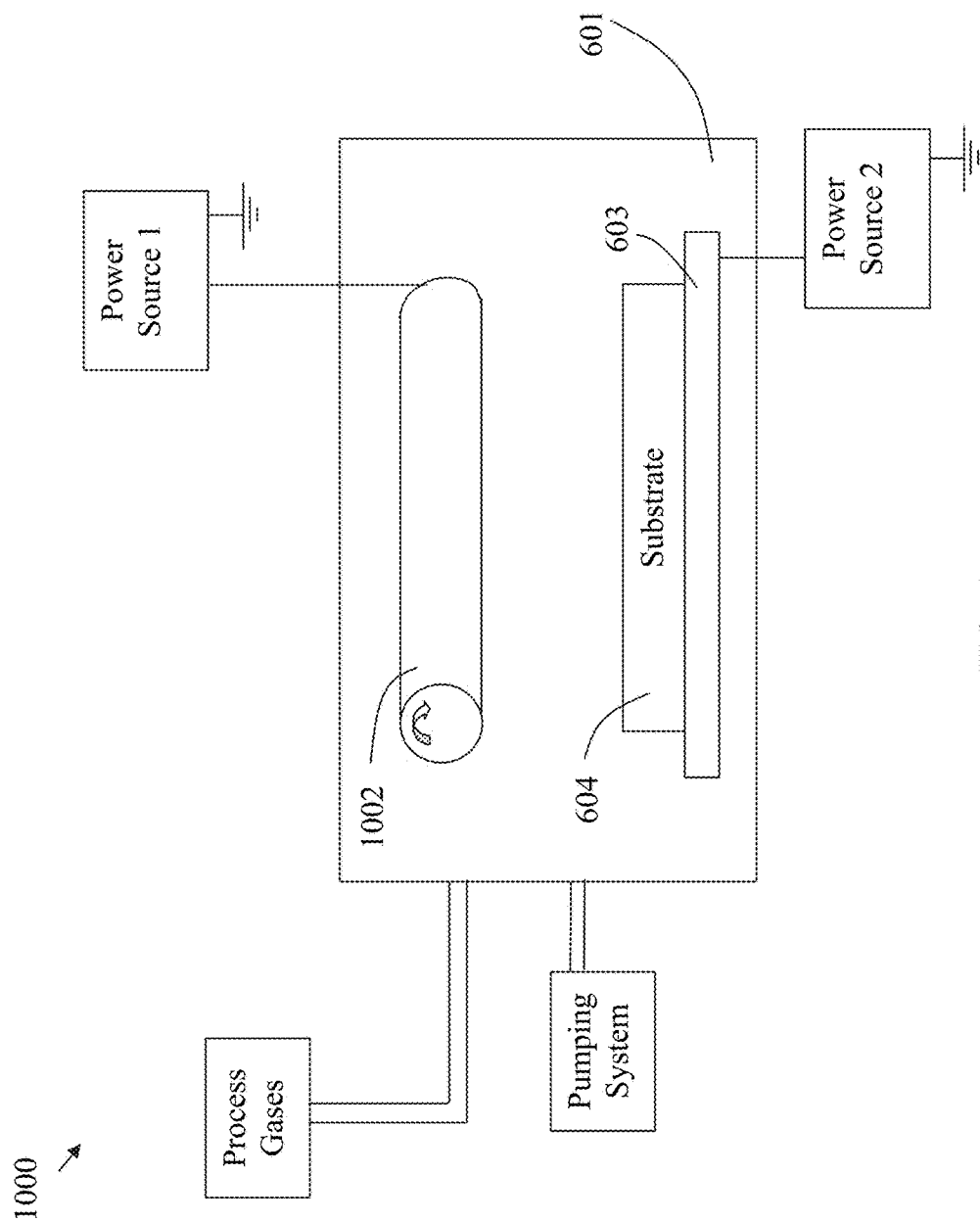
FIG. 10 is a schematic representation of a deposition chamber with a rotary sputter target, according to some embodiments of the present invention.

Although the present invention has been particularly described with reference to planar sputter targets, rotatable cylindrical sputter targets may also be used. FIG. 10 shows a schematic representation of a deposition chamber with a rotatable cylindrical sputter target, according to some embodiments of the present invention. A vacuum chamber 601 contains a rotatable cylindrical sputter target 1002 and substrate 604 held on a substrate holder 603. Process gases, such as argon and/or a reactive gas, if required, are controllably released into the chamber and a pumping system maintains a desired vacuum in the chamber. Power source 1 is connected to the target for applying DC or pulsed DC power to the target for sputtering of said target. Note that pulsed DC may be preferred if certain reactive gases are used which may result in a "poisoned" target surface—for example, when using reactive gases containing oxygen, oxides may be formed on the target surface which increase the electrical resistance of the target such that DC sputtering may no longer be efficient, and pulsed DC is needed for an efficient deposition process. A second power source—power source 2—may be used to improve deposition as described in U.S. Patent Appl. Pub. No. 2009/0288943. The rotatable cylindrical sputter target may be configured as a cylindrical version of the planar targets described above with reference to FIGS. 4A, 4B, 5A & 5B where the tiles in the cylindrical version are annular sections affixed to the surface of a cylindrical backing plate. Furthermore, the target material may be directly sprayed onto the cylindrical backing plate as a single piece, rather than being formed as annular tiles and then being affixed to the cylindrical backing plate. When spraying the target material, well mixed powders of the desired ingredients can be used. These rotatable cylindrical sputter targets can be used in inline tools (dynamic deposition, Applied Materials New Aristo™) or large area tools (static deposition, Applied Materials PIVOT™).

Figure 3:
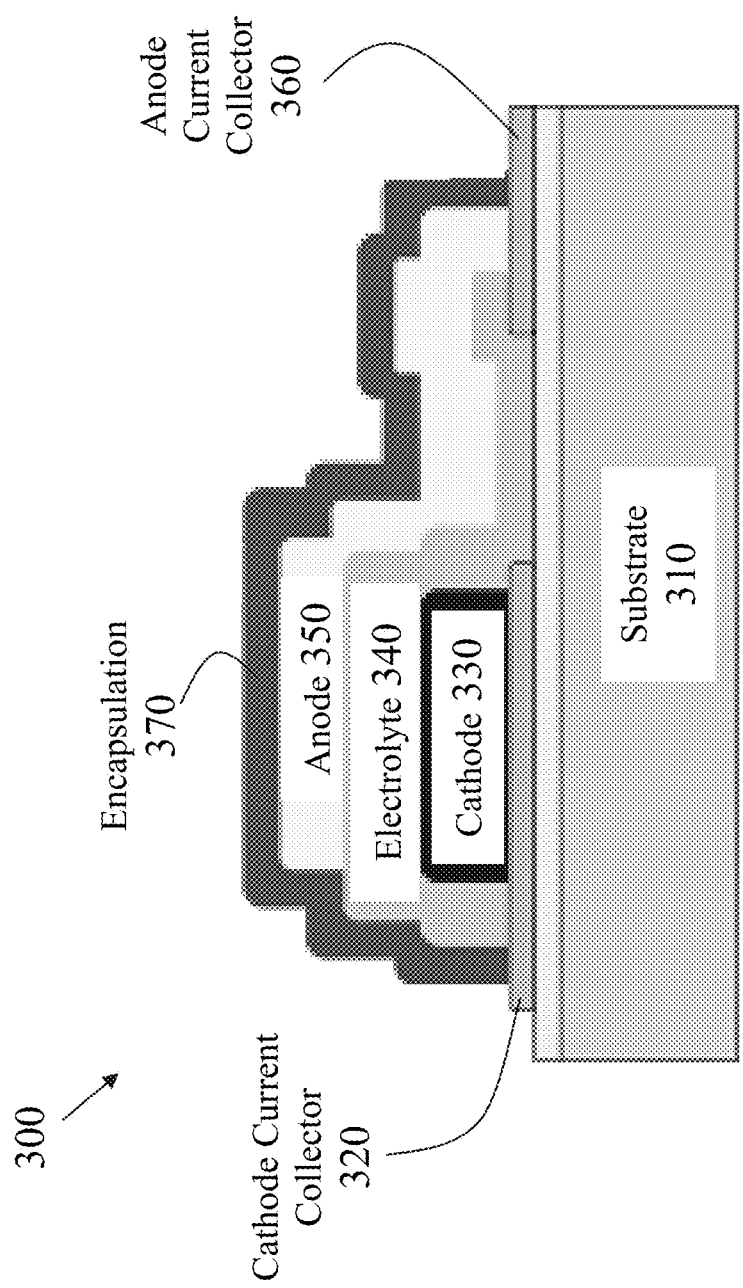
FIG. 3 is a cross-sectional representation of a prior art thin film battery.

Although the present invention has been particularly described with reference to sputter targets for deposition of electrode layers for electrochromic devices, some embodiments of the present invention are sputter targets and process flows which may be used for deposition of electrode layers for other electrochemical devices, such as thin film batteries—such as the thin film battery shown in FIG. 3 and described above.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A sputter target for electrochemical device layer deposition, comprising:
   a composite lithium-containing target material comprising:
      at least one metal material; and
      a lithium-containing salt;
      wherein said at least one metal material and said lithium-containing salt are finely divided and are formed into said composite lithium-containing target material and wherein said lithium-containing salt constitutes less than 67% by volume of said composite lithium-containing target material; and
   a backing plate, said composite lithium-containing target material being affixed to said backing plate.

2. The sputter target as in claim 1, wherein said composite lithium-containing target material is configured for deposition of a layer of $Li_xMo_yNi_zO_d$ material, said at least one metal material being metallic Mo and Ni.

3. The sputter target as in claim 2, wherein said lithium-containing salt is at least one material selected from the group consisting of LiOH, $Li_2O$, $Li_2CO_3$, $LiMoO_3$ and $Li_2MoO_4$.

4. The sputter target as in claim 1, wherein said composite lithium-containing target material is configured for deposition of a layer of $Li_xTi_yW_zO_d$ material, said at least one metal material being metallic Ti and W.

5. The sputter target as in claim 4, wherein said lithium-containing salt is at least one material selected from the group consisting of LiOH and $Li_2CO_3$.

6. The sputter target as in claim 1, wherein said composite lithium-containing target material is configured for deposition of a layer of $Li_xW_yNi_zO_d$ material, said at least one metal material being metallic W and Ni.

7. The sputter target as in claim 6, wherein said lithium-containing salt is at least one material selected from the group consisting of LiOH, $Li_2CO_3$, $Li_2O$, $LiWO_3$ and $Li_2WO_4$.

8. The sputter target as in claim 1, wherein said composite lithium-containing target material is configured for deposition of a layer of $Li_xCr_yNi_zO_d$ material, said at least one metal material being metallic Cr and Ni.

9. The sputter target as in claim 1, wherein said composite lithium-containing target material is configured for deposition of a layer of $Li_xCo_yNi_zO_d$ material, said at least one metal material being metallic Co and Ni.

10. The sputter target as in claim 1, wherein the surface resistance of said composite lithium-containing target material is in the range of 200 kΩ to 500 kΩ as measured between two probes separated by 6 mm on the surface of said composite lithium-containing target material.

11. The sputter target as in claim 1, wherein the resistance of said composite lithium-containing target material is in the range of 200 kΩ to 500 kΩ as measured between said backing plate and the sputtering surface of said composite lithium-containing target material.

12. The sputter target as in claim 1, wherein said lithium-containing salt is $Li_2CO_3$.

13. The sputter target as in claim 1, wherein said lithium-containing salt is LiOH.

14. The sputter target as in claim 8, wherein said lithium-containing salt is at least one material selected from the group consisting of LiOH and $Li_2CO_3$.

15. The sputter target as in claim 9, wherein said lithium-containing salt is at least one material selected from the group consisting of LiOH and $Li_2CO_3$.

16. The sputter target as in claim 1, wherein said sputter target is a cylindrical sputter target and said backing plate is a cylindrical backing plate.

17. The sputter target as in claim 16, wherein said composite lithium-containing target material comprises a plurality of annular tiles, each annular tile being affixed to said cylindrical backing plate.

18. The sputter target as in claim 1, wherein said composite lithium-containing target material comprises a plurality of tiles, each tile being affixed to said backing plate.

19. The sputter target as in claim 1, wherein said electrochemical device is a thin film battery.

* * * * *